United States Patent [19]
Hachiya

[11] Patent Number: 6,023,442
[45] Date of Patent: Feb. 8, 2000

[54] SEMICONDUCTOR INTEGRATED CIRCUIT MEMORY

[75] Inventor: Yutaro Hachiya, Tokyo, Japan

[73] Assignee: NEC Corporation, Tokyo, Japan

[21] Appl. No.: 08/907,947

[22] Filed: Aug. 11, 1997

[30] Foreign Application Priority Data

Aug. 9, 1996 [JP] Japan ..................................... 8-227780

[51] Int. Cl.[7] .............................. G11C 8/00; G11C 16/04
[52] U.S. Cl. ................ 365/233; 365/189.05; 365/230.08
[58] Field of Search ............................... 365/233, 189.05, 365/230.08

[56] References Cited

U.S. PATENT DOCUMENTS

| | | | |
|---|---|---|---|
| 5,530,677 | 6/1996 | Grover et al. ........................... | 365/233 |
| 5,687,134 | 11/1997 | Sugawara et al. ...................... | 365/233 |
| 5,694,371 | 12/1997 | Kawaguchi .............................. | 365/233 |
| 5,726,950 | 3/1998 | Okamoto et al. ........................ | 365/233 |
| 5,748,553 | 5/1998 | Kitamura ................................. | 365/233 |
| 5,793,665 | 8/1998 | Kim et al. ................................ | 365/233 |
| 5,805,506 | 9/1998 | Matsui ..................................... | 365/233 |
| 5,838,630 | 11/1998 | Okajima et al. ......................... | 365/233 |

*Primary Examiner*—Trong Phan
*Attorney, Agent, or Firm*—Foley & Lardner

[57] ABSTRACT

In an output data latch for a semiconductor integrated circuit memory receiving at least one or more kinds of control clocks from an external, source an output data latch control clock generating circuit is provided, which uses, as a trigger for canceling the latched condition of the output data latch, a rising edge having a high time precision, of the output latch control clock for a corresponding cycle of an effective data output, and as a trigger for starting the data latching, a rising edge having a high time precision, of the input signal fetching control clock for a cycle next to the corresponding cycle of the effective data output. It becomes possible to generate the output data latch control clock having a high time precision.

15 Claims, 11 Drawing Sheets

SEMICONDUCTOR INTEGRATED CIRCUIT MEMORY

BACKGROUND OF THE INVENTION

1. Field of the invention

The present invention relates to a semiconductor integrated circuit memory, and more specifically to a semiconductor integrated circuit memory receiving at least one or more kinds of control clocks from an external source.

2. Description of related art

In a system equipped with a CPU having the performance of an operating frequency of 100 MHz or more, a cache memory is used in order to cause the CPU to exert its performance to a maximum extent thereby to elevate the performance of the overall system. Of course, in order to maximize the system performance, a maximum operating frequency of the cache memory must follow up the operating frequency of the system. In addition, considering the operation of the overall system, not only the operating frequency of the cache memory but also a holding time of an effective data outputted from the cache memory are important factors.

At present, under the above mentioned circumstances, for the cache memory, a system has been introduced which uses an input control clock mainly for fetching an input signal and an output control clock mainly for controlling the latching of an output signal, for the purpose of elevating the performance of the system.

In the following, an operation of a circuit using two kinds of clocks, namely, an input control clock and an output control clock for the cache memory, will be described.

Figure 1:
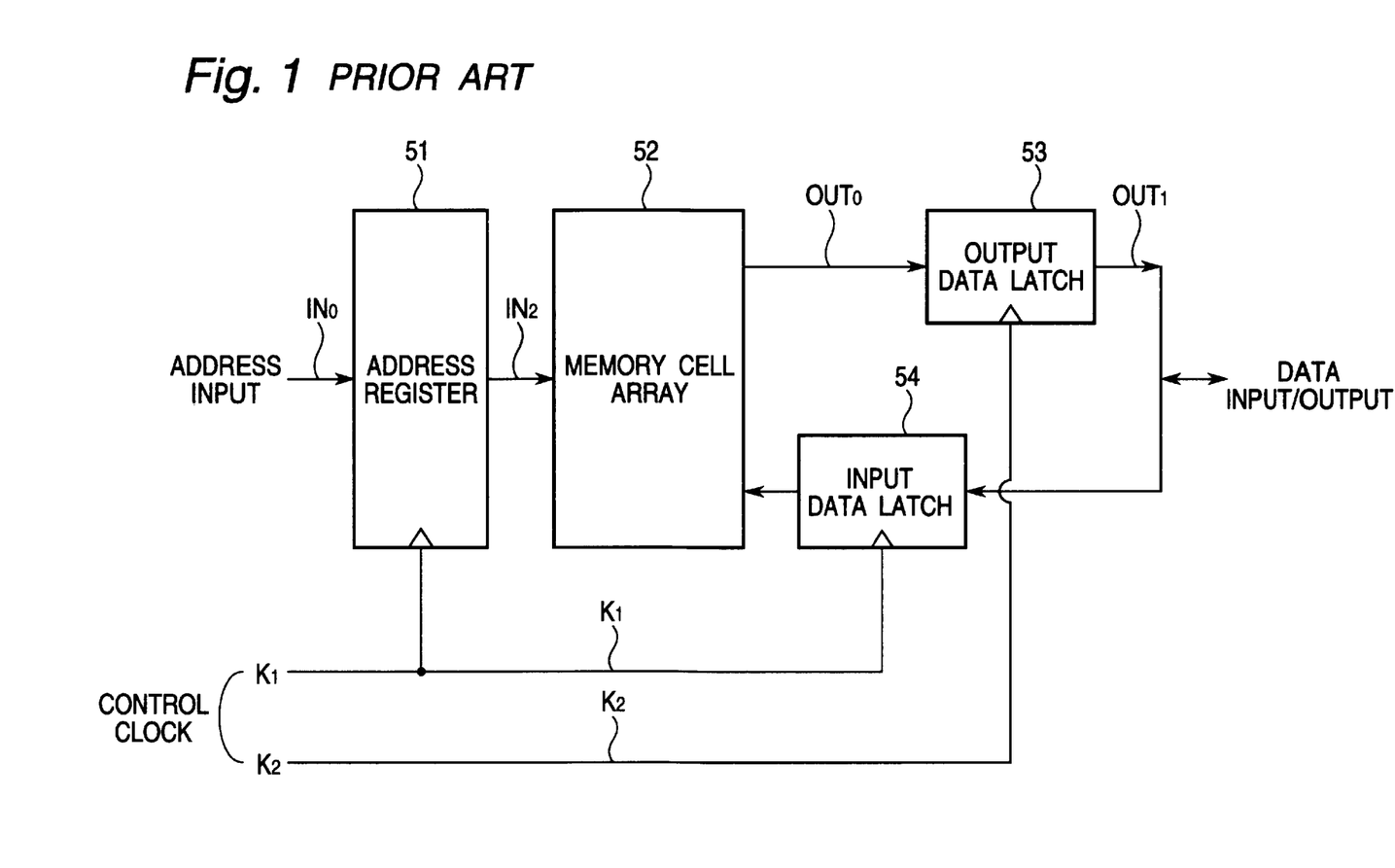
FIG. 1 is a block diagram of a reading system of the prior art semiconductor memory.

FIG. 1 is a block diagram illustrating the construction of a prior art cache memory using the input control clock and the output control clock. In FIG. 1, Reference Numeral 51 designates an address register, and Reference Numeral 52 shows a memory cell array. Reference Numeral 53 indicates an output data latch, and Reference Numeral 54 denotes an input data latch. Reference Sign IN0 designates an input signal line to the address register 51, and Reference Sign IN2 shows an output signal line from the address register 51. Reference Sign OUT0 indicates an input signal line to the output data latch 53, and Reference Sign OUT1 denotes an output signal line from the output data latch 53. Reference Sign K1 designates a control clock for fetching the input signal, and Reference Sign K2 shows an output control clock for controlling the latching of an output signal.

Figure 2:
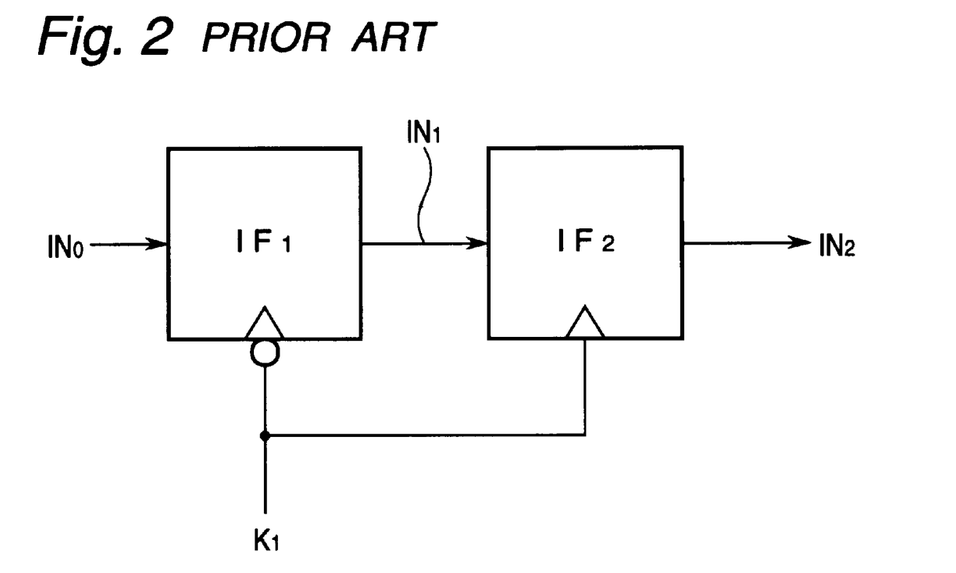
FIG. 2 is a diagram showing the construction of the address input register in the reading system of the prior art semiconductor memory.

FIG. 2 is a block diagram showing the construction of the address register 51. In FIG. 2, IN0 and IN2 are the same as those shown in FIG. 1, and indicate the input signal line to the address register 51 and the output signal line from the address register 51, respectively. Reference Sign IF1 designates a flipflop put into a holding condition in response to a rising of the control clock K1, and Reference Sign IF2 shows a flipflop put into a holding condition in response to a falling of the control clock K1. Reference Sign IN1 indicates a signal line that is both an output signal line of the flipflop IF1 and an input signal line of the flipflop IF2.

The address register 51 is constituted of these two flipflops IF1 and IF2 controlled by the control clock K1. An address is fetched into the memory cell array 52 in response to the control clock K1, and a corresponding address location within the memory cell array 52 is accessed so that an effective data is outputted to the output data latch 53.

Furthermore, the outputted data is fetched in the output data latch 53, and properly outputted and held, i.e., maintained as an output data.

Figure 3:
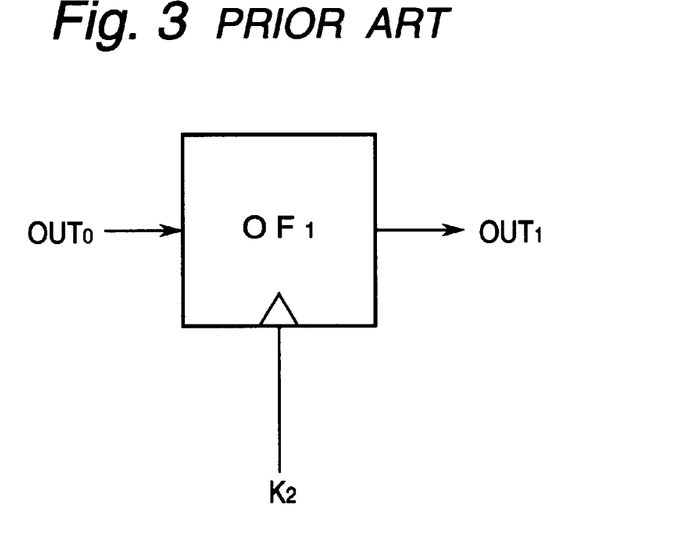
FIG. 3 is a diagram showing the construction of the output data latch in the reading system of the prior art semiconductor memory.

FIG. 3 is a block diagram illustrating the construction of the output data latch 53. Reference Signs OUT0 and OUT1 designate the input signal line to the output data latch 53 and the output signal line from the output data latch 53, respectively, and are the same as those shown in FIG. 1. Reference Sign OF1 shows a flipflop put into a holding condition in response to a falling of the control clock K2. During a period of a high level of the control clock K2, the flipflop OF1 is put in a pass-through condition so that the level on the line OUT0 is transferred to the line OUT1. On the other hand, during a period of a low level of the control clock K2, the level on the line OUT0 is not transferred to the line OUT1, and the level on the line OUT1 is held (for example, the flipflop OF1 holds the value on the line OUT1 at the moment the control clock K2 changes from the high level to the low level).

Figure 4:
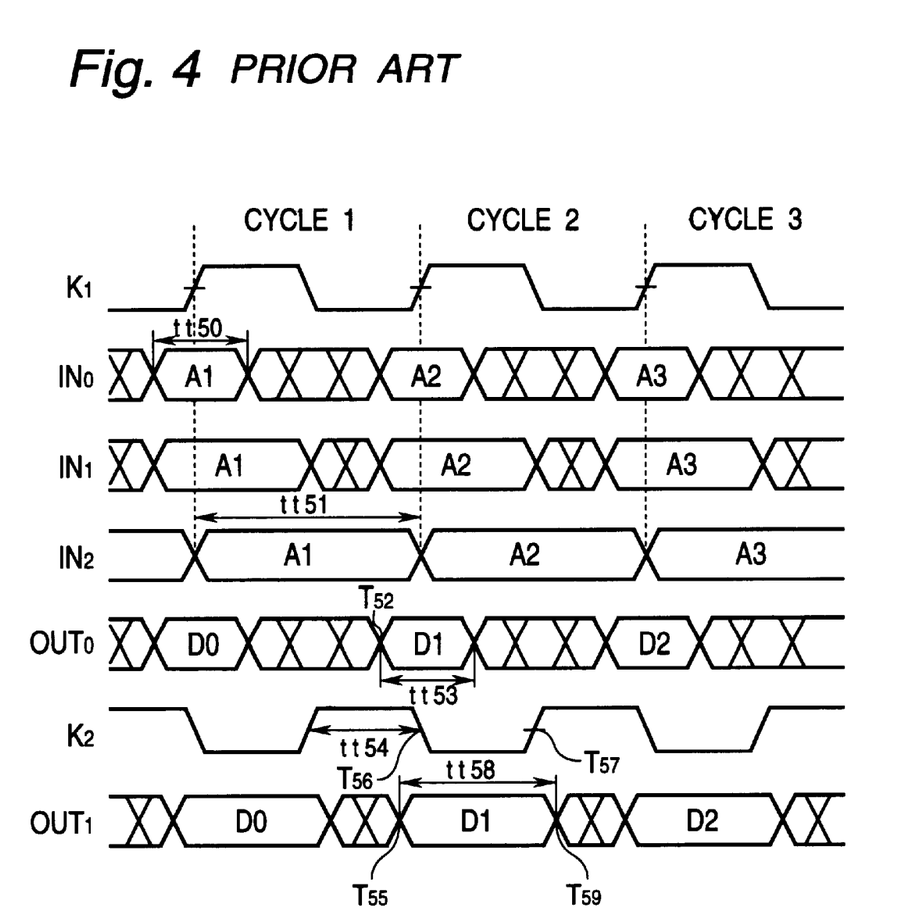
FIG. 4 is a waveform diagram illustrating an internal operation of the prior art semiconductor memory when the falling timing of the control clock K2 does not vary.

Now, a fundamental operation of the cache memory shown in FIG. 1 will be described with a signal waveform diagram. FIG. 4 is a waveform diagram when the control clocks K1 and K2 having a desired waveform are supplied. Here, in order to explain the fundamental operation, an example of a read sequence will be described.

First, an address "A1" having an effective period of "tt50" on the signal line IN0 is supplied to the address register 51 in synchronism with the control clock K1. In addition, the address "A1" is transferred to the signal line IN1 in synchronism with the control clock K1, so that finally, the address is transferred to the line IN2 as the input to the memory cell array 52.

Thus, the address "A1" is held as an internal address for a cycle of "tt51".

As a result, an effective data "D1" corresponding to the address "A1" is outputted to the input OUT0 of the output data latch 53 at a time T52. An effective period of this data "D1" is "tt53".

As mentioned above, during the period of the pass-through condition of the output data latch 53, namely, during the high level period (="tt54") of the control clock K2, the effective data "D1" is transferred from the line OUT0, and outputted to the line OUT1 at a time T55.

Thereafter, if the control clock K2 is brought to the low level at a time T56, the output data latch 53 is put into the holding condition, so that the effective data "D1" is held at the line OUT1.

At a time T57, when the control clock K2 is brought to the high level, the output data latch 53 is put in the pass-through condition, so that an indefinite data on the line OUT0 is transferred, and outputted to the line OUT1 at a time T59. In this case, the output data on the line OUT1 has an effective period "tt58".

Figure 5:
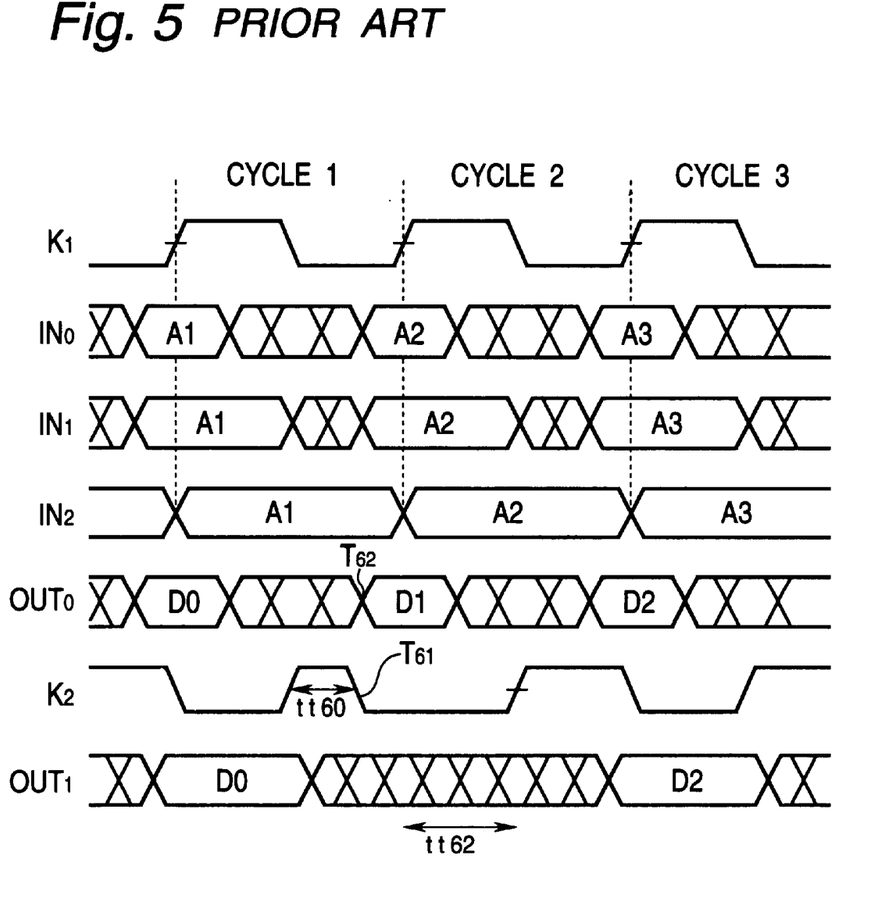
FIG. 5 is a waveform diagram for illustrating an internal operation of the prior art semiconductor memory when the falling timing of the control clock K2 is shifted to become earlier than the desired timing.

FIG. 5 is a timing chart for illustrating the operation when the control clock K2 having the high level of the width "tt60" shorter than the desired width "tt54" of the control clock K2 is supplied in the cycle 1. In FIG. 5, the operation until the data is outputted to the line OUT0 is the same as that explained with reference to FIG. 4.

Referring to FIG. 5, the control clock K2 having the high level of the width "tt60" shorter than the desired width is supplied, and the control clock K2 is brought to the low level at a timing T61, so that the output data latch 53 is put into the holding condition. However, since this time T61 is earlier than a time T62 where the effective data "D1" reaches the line OUT0, the effective data "D1" is not held in the output data latch 53, and an indefinite data prior to the effective data "D1" is held in the output data latch 53. In other words, the effective data "D1" is not outputted.

In this case, if the effective period of the output data at the output OUT1 of the output data latch 63 is represented by "tt62", tt62=0. Of course, the memory is defective.

Figure 6:
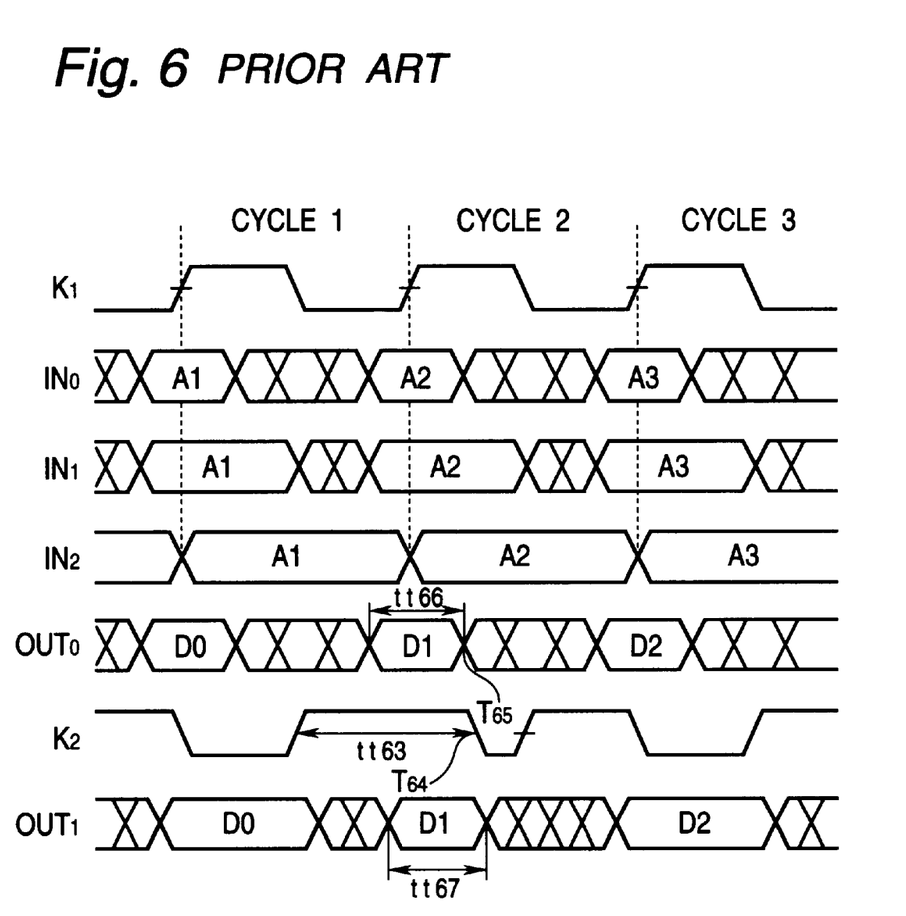
FIG. 6 is a waveform diagram for illustrating an internal operation of the prior art semiconductor memory when the falling timing of the control clock K2 is shifted to become later than the desired timing.

FIG. 6 is a timing chart for illustrating the operation when the control clock K2 having the high level of the width "tt63" longer than the desired width "tt54" of the control clock K2 is supplied in the cycle 1. In FIG. 6, the operation until the data is outputted to the line OUT0 is the same as that explained with reference to FIG. 4.

Referring to FIG. 6, the control clock K2 having the high level of the width "tt63" longer than the desired width is supplied, and the control clock K2 is brought to the low level at a timing T64, so that the output data latch 53 is put into the holding condition. However, since this time T64 is later than a time T65 until which the effective data "D1" is held at the line OUT0, the effective data "D1" is not held in the output data latch 53, and an indefinite data next to the effective data "D1" is held in the output data latch 53. In other words, the effective data "D1" is outputted during only a period of a minimum value "tt66".

In this case, if the effective period of the output data at the output OUT1 of the output data latch 53 is represented by "tt67", comparing "tt67" with the effective period "tt58" of the output data in a normal case, i.e., it becomes tt58>>tt67 ("tt67" is much shorter than "tt58"), with the result that "tt67" is not enough for the CPU in the system to ascertain the effective data. Accordingly, of course, the memory is also defective.

As mentioned above, the prior art semiconductor integrated circuit memory has a problem that, when the falling timing of the control clock for controlling the latching of the output signal varies before and after, in time in particular when the falling timing is advanced, no effective synchronous data can be synchronously latched in the output data latch, and therefore, no effective data can be outputted. Furthermore, there is another problem that, in particular when the falling timing is delayed, the effective data cannot be normally latched in the output data latch, with the result that the indefinite data is latched and on the other hand the effective outputting period of the effective data becomes insufficient for the CPU in the system to recognize the effective data.

Generally, it is difficult to precisely control both the rising timing and the falling timing of the clock in the system. Therefore, it is an ordinary practice that it is attempted to precisely control the rising timing of the clock as being more important to the system. In this case, however, the precision of the falling timing is remarkably deteriorated.

In conclusion, such a situation easily occurs that the falling timing of the control clock for controlling the latching of the output signal varies before and after in time. As a result, such a situation also easily occurs that, as mentioned above the operation of the memory becomes unsatisfactory in the system.

SUMMARY OF THE INVENTION

Accordingly, it is an object of the present invention to provide a semiconductor integrated circuit memory which has overcome the above mentioned problems of the prior art.

Another object of the present invention is to provide a semiconductor integrated circuit memory capable of outputting an effective data at an appropriate timing and of holding the effective data for an effective length of time sufficient for a CPU in a system to be able to recognize the output data as a valid data, even if the precision of the falling timing of the memory control clock in the system is insufficient.

In order to achieve the above mentioned objects of the present invention, the semiconductor integrated circuit memory in accordance with the present invention is a clock-synchronized semiconductor integrated circuit memory having a clock input for a first external clock used for fetching an input and a clock input for a second external clock used for updating an output, and is characterized by including a means responding to a rising of the second external clock for generating a signal canceling a holding condition of an effective output value of a memory data, the means also responding to a rising of the first external clock following the rising of the second external clock, for starting the holding condition of the effective output value of the memory data.

DESCRIPTION OF THE PREFERRED EMBODIMENTS

Now, embodiments of the semiconductor memory in accordance with the present invention will be described with reference to the accompanying drawings.

Figure 7:
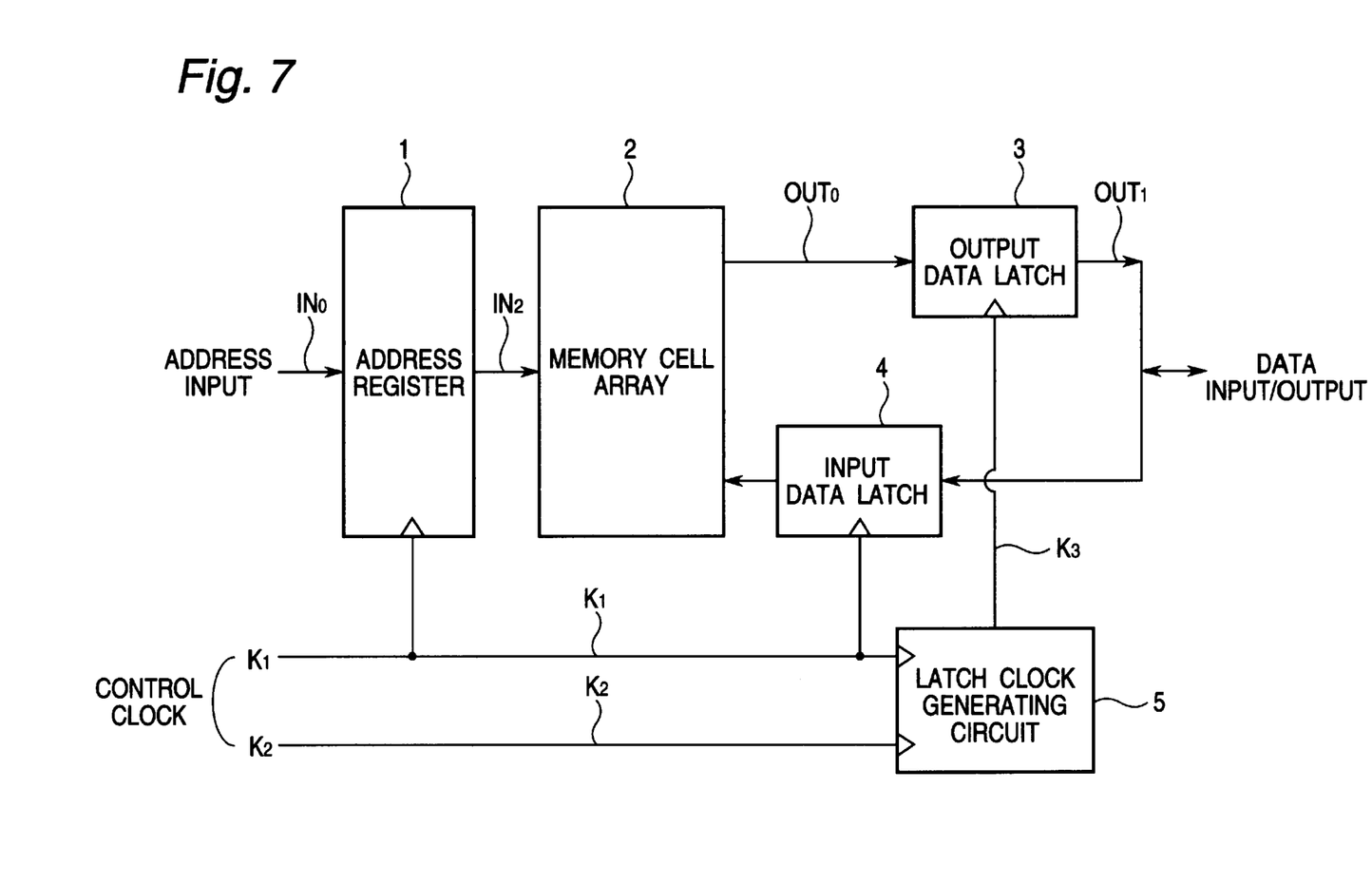
FIG. 7 is a block diagram of the reading system of an embodiment of the semiconductor memory in accordance with the present invention.

FIG. 7 is a block diagram illustrating the construction of the cache memory which is an embodiment of the semiconductor memory in accordance with the present invention. In FIG. 7, Reference Numeral 1 designates an address register, and Reference Numeral 2 shows a memory cell array. Reference Numeral 3 indicates an output data latch, and Reference Numeral 4 denotes an input data latch. Reference Numeral 5 designates a latch clock generating circuit 5. Reference Sign IN0 designates an input signal line to the address register 1, and Reference Sign IN2 shows an output signal line from the address register 1.

Reference Sign OUT0 indicates an input signal line to the output data latch 3, and Reference Sign OUT1 denotes an output signal line from the output data latch 3. Reference Sign K1 designates a control clock mainly for fetching the input signal, and Reference Sign K2 shows a control clock for controlling the latching of an output signal. Reference Sign K3 shows an output control clock which is generated from the above mentioned control clocks K1 and K2 and which is used for controlling the latching of a final output signal.

Figure 8:
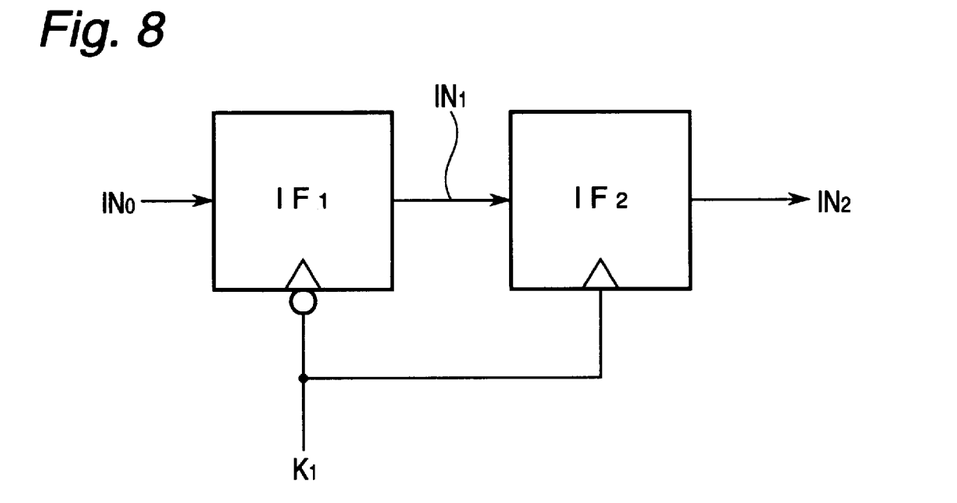
FIG. 8 is a diagram showing the construction of the address input register in the reading system of the embodiment of the semiconductor memory in accordance with the present invention.

FIG. 8 is a block diagram showing the construction of the address register 1. In FIG. 8, IN0 and IN2 designate the input signal line to the address register 1 and the output signal line from the address register 1, respectively, and therefore, are the same as those shown in FIG. 7.

Reference Sign IF1 designates a flipflop put into a holding condition in response to a rising of the control clock K1, and Reference Sign IF2 shows a flipflop put into a holding condition in response to a falling of the control clock K1. Reference Sign IN1 indicates a signal line that is both an output signal line of the flipflop IF1 and an input signal line of the flipflop IF2.

The address register 1 is constituted of these two flipflops IF1 and IF2 controlled by the control clock K1. An address is fetched into the memory cell array 2 in response to the control clock K1, and a corresponding address location within the memory cell array 2 is accessed so that an effective data is outputted to the output data latch 3.

Furthermore, the outputted data is fetched in the output data latch 3, and properly outputted and held i.e., maintained as an output data.

Figure 9:
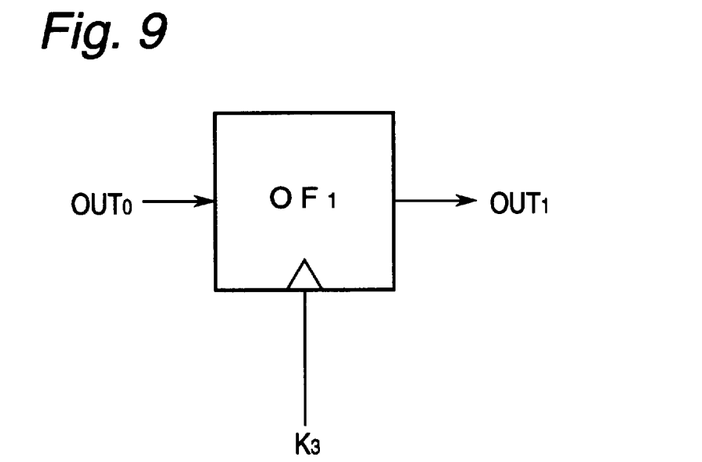
FIG. 9 is a diagram showing the construction of the output data latch in the reading system of the embodiment of the semiconductor memory in accordance with the present invention.

FIG. 9 is a block diagram illustrating the construction of the output data latch 3. Reference Signs OUT0 and OUT1 designate the input signal line to the output data latch 3 and the output signal line from the output data latch 3, respectively, and therefore, are the same as those shown in FIG. 7. Reference Sign OF1 shows a flipflop put into a holding condition in response to a falling of the control clock K3. During a period of a high level of the control clock K3, the flipflop OF1 is put in an pass-through condition so that the level on the line OUT0 is transferred to the line OUT1. On the other hand, during a period of a low level of the control clock K3, the level on the line OUT0 is not transferred to the line OUT1, and the level on the line OUT1 is held, i.e., maintained.

Figure 10:
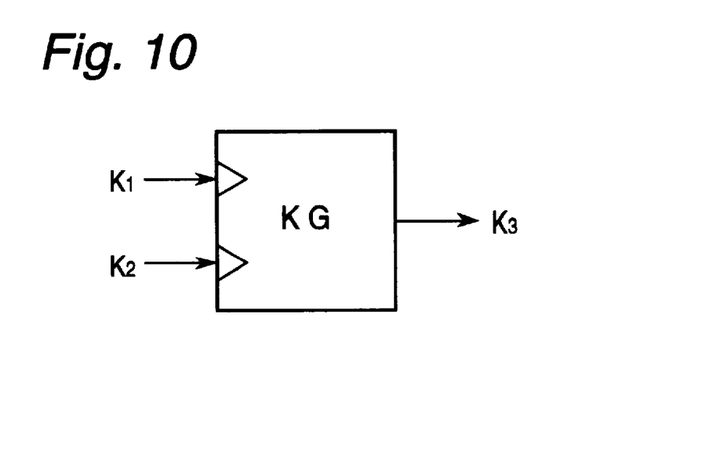
FIG. 10 is a diagram showing the construction of a circuit for generating an output control clock K3 in the reading system of the embodiment of the semiconductor memory in accordance with the present invention.

FIG. 10 is a block diagram illustrating the construction of the circuit 5 for generating the output control clock K3. In the drawing, Reference Sign KG designates a clock generating block, which generates the output control clock K3 on the basis of the rising of the control clock K1 and the rising of the control clock K2.

Figure 11A:
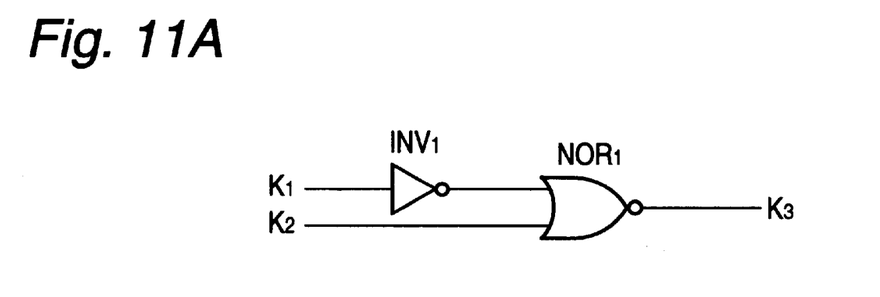
FIG. 11A is a diagram showing one example of the circuit construction of the circuit for generating the output control clock K3 in the reading system of the embodiment of the semiconductor memory in accordance with the present invention.

FIG. 11A is a block diagram illustrating the circuit construction of one example of the circuit 5 for generating the output control clock K3. In the drawing, Reference Sign INV1 designates an inverter receiving the clock K1, and Reference Sign NOR1 indicates a two-input NOR gate receiving the clock K2 and an output of the inverter INV1.

Figure 11B:
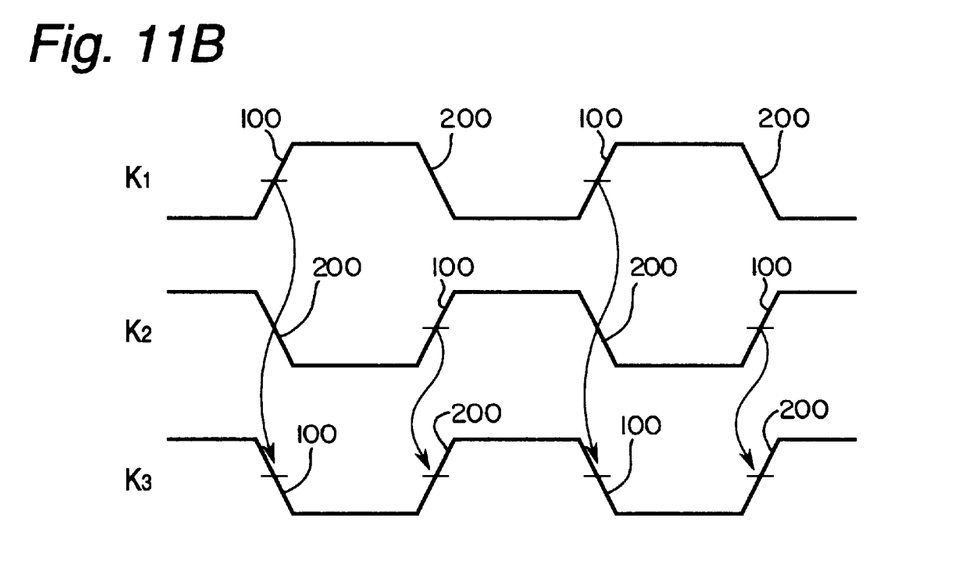
FIG. 11B is a timing chart illustrating an operation of the circuit for generating the output control clock K3, shown in FIG. 11A.

As shown in the timing chart of FIG. 11B, a combined logic composed of the inverter INV1 and the NOR gate NOR1 causes the output, e.g., second transition 200, of the control clock K3 to rise in response to the rising of the control clock K2 first transition 100, and the first transition 100 of the control clock K3 to fall in response to the rising of the control clock K1 first transition 100.

Figure 12:
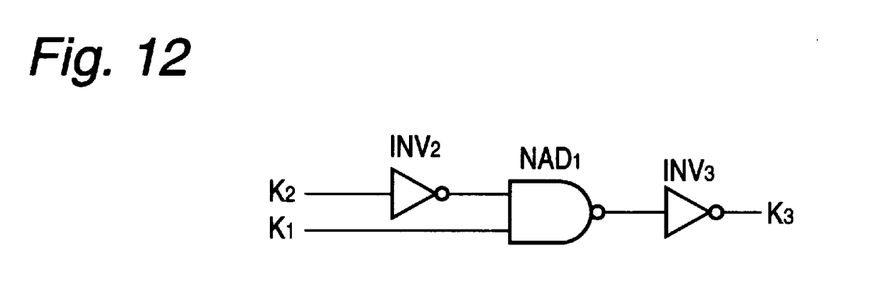
FIG. 12 is a diagram showing another example of the circuit construction of the circuit for generating the output control clock K3 in the reading system of the embodiment of the semiconductor memory in accordance with the present invention.

FIG. 12 is a block diagram illustrating the circuit construction of another example of the circuit 5 for generating the output control clock K3. In the drawing, Reference Sign INV2 designates an inverter receiving the clock K2, and Reference Sign NAD1 indicates a two-input NAND gate receiving the clock K1 and an output of the inverter INV2. Reference Sign INV3 denotes an inverter receiving an output of the NAND gate NAD1. A combined logic composed of the inverter INV2, the NAND gate NAD1 and the inverter INV3 causes the output control clock K3 to rise in response to the rising of the control clock K2 and to fall in response to the rising of the control clock K1, as shown in the timing chart of FIG. 11B, and similarly to the construction shown in FIG. 11A.

The above mentioned embodiment of the present invention will be described with reference to timing charts in order to explain the embodiment of the present invention in detail.

Figure 13:
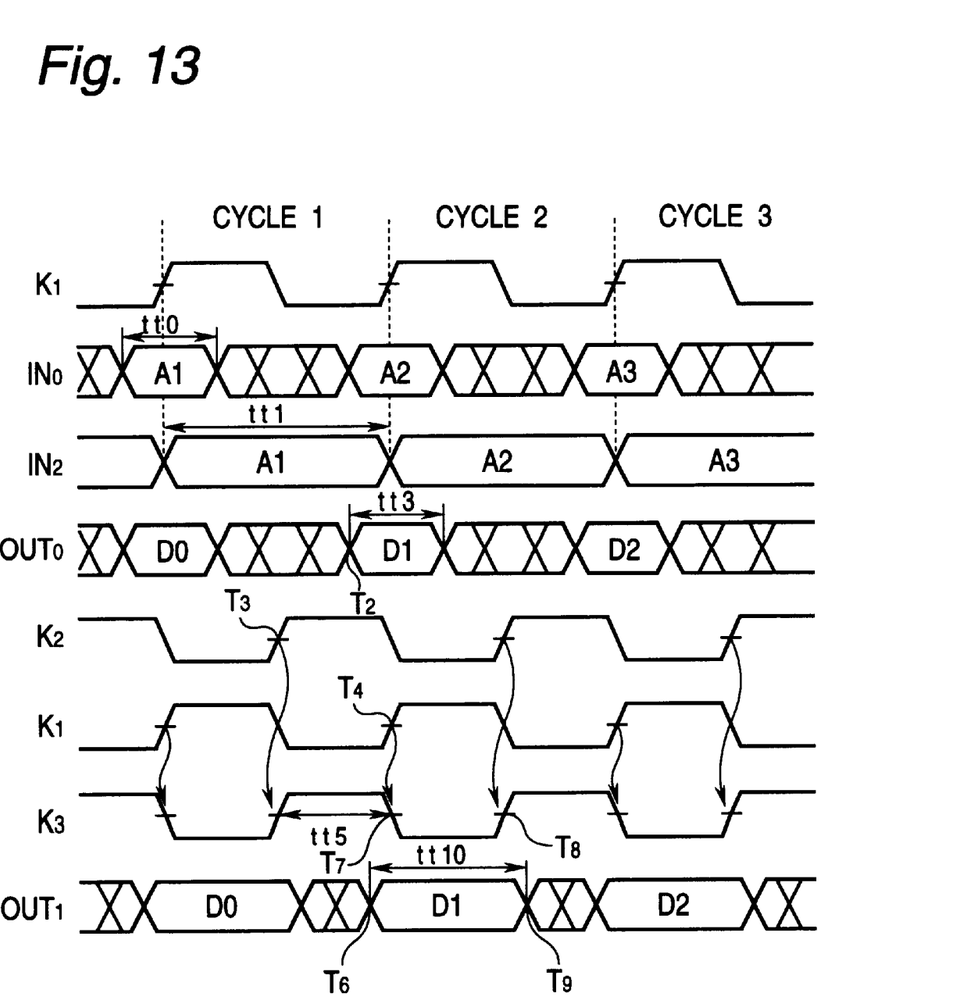
FIG. 13 is a waveform diagram illustrating an internal operation of the reading system of the embodiment of the semiconductor memory in accordance with the present invention when the falling timing of the control clock K2 does not vary.

Now, a fundamental operation of the circuit shown in FIG. 7 as the embodiment of the present invention will be described. FIG. 13 is a timing chart for illustrating an operation of timing of the memory when the falling timing portion of the control clock K2 does not vary, namely, when desired control clocks are supplied as the control clocks K1 and K2. Here, in order to explain the fundamental operation, an example of a read sequence will be described.

In synchronism with the control clock K1, the address "A1" having an effective period "tt0" is supplied to the signal line IN0. In addition, the address "A1" is transferred to the signal line IN1 shown in FIG. 8 in synchronism with the control clock K1, and finally transferred to the line IN2 as the input to the memory cell array 2.

Therefore, the address "A1" is held as an internal address for a period "tt1" equal to a period of one cycle. As a result, an effective data "D1" is outputted to the line OUT0 of the output data latch 3 at a timing T2. This effective data "D1" has an effective period "tt3".

As mentioned above, during the period of the pass-through condition of the output data latch 3, namely, during a high level period "tt5" of the control pulse K3 determined by a rising timing T3 of the control clock K2 and a rising timing T4 of the control clock K1 following the rising timing T3 of the control clock K2 in time, the effective data "D1" is transferred from the line OUT0, and is outputted to the line OUT1 at a timing T6.

Thereafter, when the control clock K3 is brought to the low level at a timing T7, the output data latch 3 is put in the holding condition, so that the effective data "D1" is held on the line OUT1.

At a timing T8, the control clock K3 is brought to the high level, so that the output data latch 3 is put in the pass-through condition, and an indefinite data on the line OUT0 is transferred, and outputted to the line OUT1 at a timing T9. In this case, an effective period of the output data on the output OUT1 of the output data latch 3 becomes "tt10".

Figure 14:
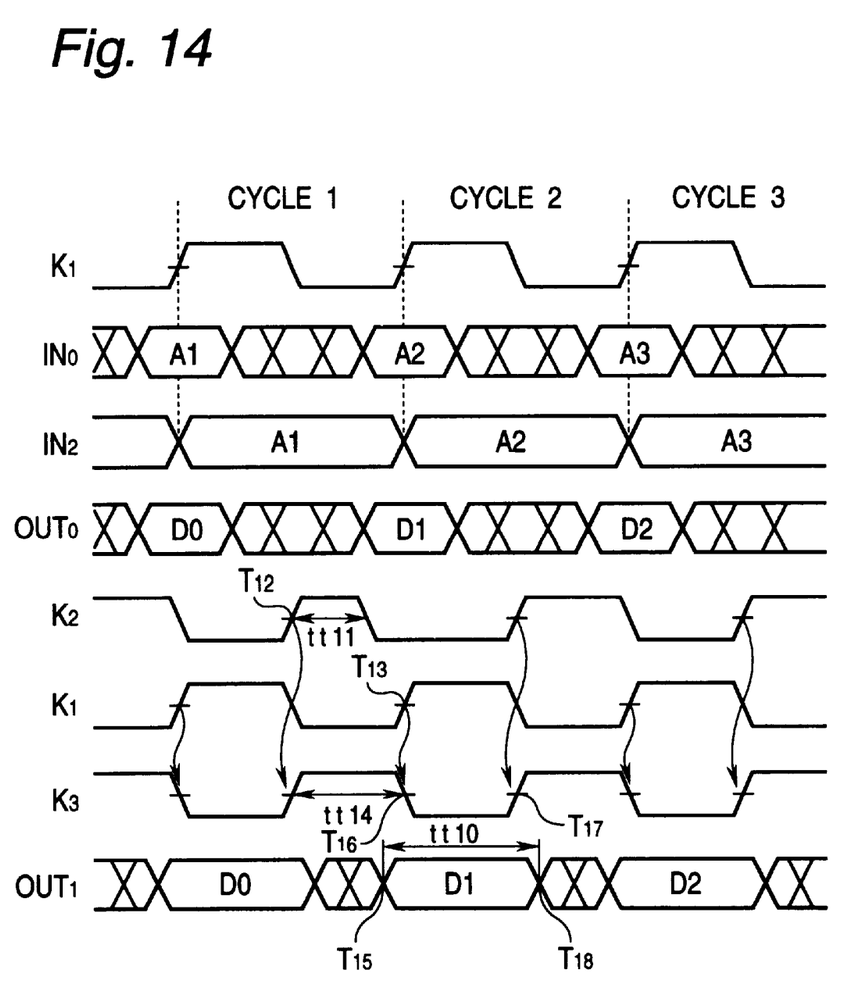
FIG. 14 is a waveform diagram for illustrating an internal operation of the reading system of the embodiment of the semiconductor memory in accordance with the present invention when the falling timing of the control clock K2 is shifted to become earlier than the desired timing.

FIG. 14 is a timing waveform diagram for illustrating the internal operation of the timing of the memory when the falling of the control clock K2 is shifted to become earlier than a desired timing, namely, when the control clock K2 having the high level of the width "tt11" shorter than the desired width "tt5" of the control clock K2 is supplied in the cycle 1. The operation until the data is outputted to the line OUT0 is the same as that explained with reference to FIG. 13.

The control clock K2 having the high level of the width "tt11" shorter than the desired width is supplied. However, the period of the pass-through condition of the output data latch 3 (the high level period of the control pulse K3) is determined by the rising timing T12 of the control clock K2 and the rising timing T13 of the control clock K1 following the rising timing T12 of the control clock K2 in time.

Referring to FIG. 14, during the high level period "tt14" of the control pulse K3, the output data latch 53 is maintained in the pass-through condition, so that the effective data "D1" is transferred from the line OUT0, and is outputted to the line OUT1 at a timing T15.

Thereafter, when the control clock K3 is brought to the low level at a timing T16, the output data latch 3 is put in the holding condition, so that the effective data "D1" is held on the line OUT1.

At a timing T17, the control clock K3 is brought to the high level, so that the output data latch 3 is put in the pass-through condition, and an indefinite data on the line OUT0 is transferred, and outputted to the line OUT1 at a timing T18. In this case, although the falling timing of the control clock K2 is earlier than the desired timing, an effective period of the output data on the output line OUT1 becomes "tt10", similar to the case that the falling timing of the control clock K2 is the same as the desired timing.

Figure 15:
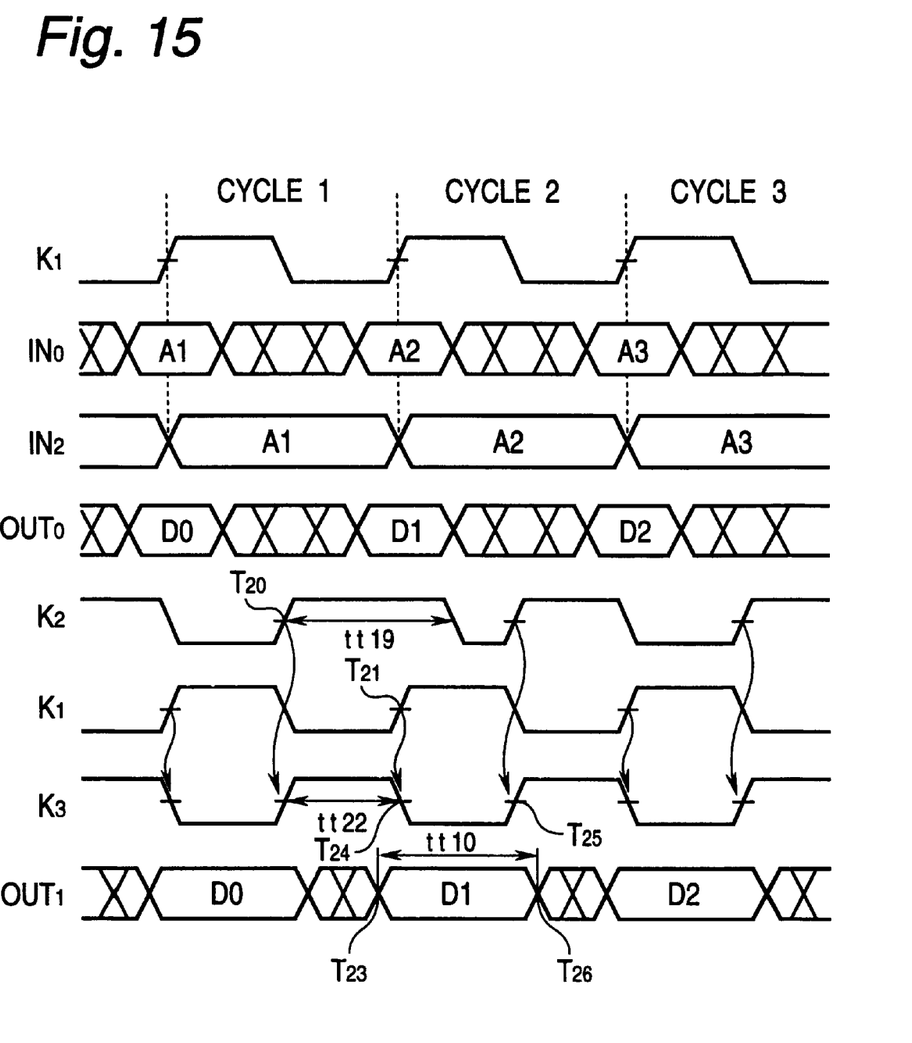
FIG. 15 is a waveform diagram for illustrating an internal operation of the reading system of the embodiment of the semiconductor memory in accordance with the present invention when the falling timing of the control clock K2 is shifted to become later than the desired timing.

FIG. 15 is a timing waveform diagram for illustrating the internal operation of the memory when the falling of the timing of the control clock K2 is shifted to become later than a desired timing, namely, when the control clock K2 having the high level of the width "tt19" longer than the desired width "tt5" of the control clock K2 is supplied in the cycle 1. The operation until the data is outputted to the line OUT0 is the same as that explained with reference to FIG. 13.

The control clock K2 having the high level of the width "tt19" longer than the desired width is supplied. However, the period of the pass-through condition of the output data latch 3 is determined by the rising timing T20 of the control clock K2 and the rising timing T21 of the control clock K1 following the rising timing T20 of the control clock K2 in time.

During the high level period "tt22" of the control pulse K3, the effective data "D1" is transferred from the line OUT0, and is outputted to the line OUT1 at a timing T23. Thereafter, when the control clock K3 is brought to the low level at a timing T24, the output data latch 3 is put in the holding condition, so that the effective data "D1" is held on the line OUT1.

At a timing T24, the control clock K3 is brought to the high level, so that the output data latch 3 is put in the pass-through condition, and an indefinite data on the line OUT0 is transferred, and outputted to the line OUT1 at a timing T26. In this case, although the falling timing of the control clock K2 is later than the desired timing, an effective period of the output data on the output line OUT1 of the output data latch 3 becomes "tt10", similar to the case that the falling timing of the control clock K2 is the same as the desired timing.

As mentioned above, according to the present invention, the output data latch is associated with an output data latch control clock generating circuit configured to use, as a trigger for canceling the latched condition of the output data latch, a rising edge having a high time precision, of the output latch control clock for a corresponding cycle of an effective data output, and as a trigger for starting the data latching, a rising edge having a high time precision, of the input signal fetching control clock for a cycle next to the corresponding cycle of the effective data output. With this arrangement, it becomes possible to generate the output data latch control clock having a high time precision, an therefore, the problem mentioned hereinbefore can be overcome.

As a result, according to the present invention, the degree of adaptation of the semiconductor integrated circuit memory a synchronous data into the system equipped with the CPU can be elevated, and the performance of the overall system can be elevated.

I claim:

1. A circuit, for converting asynchronous data to synchronous data, comprising:

a clock generating circuit, said clock generating circuit receiving a first and a second clock signal, and said clock generating circuit outputting a third clock signal, wherein a first transition of said third clock signal is generated from a first transition of said first clock signal, a second transition of said third clock signal, opposite said first transition of said third clock signal, is generated from a first transition of said second clock signal, an output circuit, coupled to said clock generating circuit, for receiving said third clock signal, and having an input for receiving said asynchronous data, said output circuit having an output, and producing said asynchronous data in synchronism with said third clock signal, to thereby generate said synchronous data at said output, an address register circuit, said address resister circuit having an input for receiving an input signal and having an output, and a memory circuit, said memory circuit having an input connected to said output of said address register, and having an output coupled to said input of said output circuit, said output of said memory circuit providing said asynchronous data.

2. A circuit, as recited in claim 1, wherein said first transition, of said third clock signal, is a leading edge, said second transition, of said third clock signal, is a trailing edge, said first transition, of said first clock signal, is a leading edge, and said first transition, of said second clock signal, is a leading edge.

3. A circuit, as recited in claim 2, wherein said leading edge of said third clock signal corresponds to a relative increase in voltage, said trailing edge of said third clock signal corresponds to a relative decrease in voltage, said leading edge of said first clock signal corresponds to a relative increase in voltage, and said leading edge of said second clock signal corresponds to a relative increase in voltage.

4. A circuit, as recited in claim 1, wherein at least a portion of said output of said synchronous data is delayed by one clock cycle, with respect to said first clock signal being input into said clock generating circuit.

5. A circuit, as recited in claim 1, wherein at least a portion of said output of said synchronous data is delayed by one clock cycle with respect to said second clock signal being input into said clock generating circuit.

6. A circuit, as recited in claim 1, wherein said address register circuit further comprises:

a first holding circuit, wherein said input to said address register is coupled with an input into said first holding circuit, a second holding circuit, wherein an output of said first holding circuit is connected to an input of said second holding circuit, and wherein said first clock signal is connected to an input of each of said first and second holding circuits.

7. A circuit, as recited in claim 6, wherein said first holding circuit is placed in a holding condition in response to a rising of said first clock signal, and wherein said second holding circuit is placed in a holding condition in response to a falling of said first clock signal.

8. A circuit, as recited in claim 6, wherein said first and second holding circuits each comprises a flip-flop circuit.

9. A circuit, as recited in claim 1, wherein said output circuit comprises a flip-flop circuit.

10. A circuit, as recited in claim 1, wherein said output circuit is placed in a holding condition, in response to a falling edge of said third clock signal, and wherein said output circuit is placed in a pass-through condition in response to a relatively high level of said third clock signal.

11. A circuit, as recited in claim 10, wherein at least a portion of said holding condition operates such that said asynchronous data, on said input of said output circuit, is not output from said output circuit, and wherein at least a portion, of said pass-through condition, operates such that said asynchronous data, on said input of said output circuit, passes through said output circuit to produce said synchronous data.

12. A circuit, as recited in claim 1, wherein said clock generating circuit further comprises a first inverter, having an input for receiving said second clock signal, and having an output, a NAND gate, having a first input for receiving said first clock signal, and a second input for receiving said output of said inverter, said NAND gate having an output, a second inverter, having an input for receiving said output of said NAND gate, said second inverter having an output coupled with said input of said output circuit, wherein said output of said second inverter generates said third clock signal.

13. A circuit, for converting asynchronous data to synchronous data, comprising:

a clock generating circuit, said clock generating circuit receiving a first and a second clock signal, and said clock generating circuit outputting a third clock signal, wherein a first transition of said third clock signal is generated from a first transition of said first clock signal, a second transition of said third clock signal, opposite said first transition of said third clock signal, is generated from a first transition of said second clock signal, an output circuit, coupled to said clock generating circuit, for receiving said third clock signal, and having an input for receiving said asynchronous data, said output circuit having an output, and producing said asynchronous data in synchronism with said third clock signal, to thereby generate said synchronous data at said output, an inverter, having an input for receiving said first clock signal, and having an output, and a NOR gate having a first input for receiving said second clock signal and a second input for receiving said output of said inverter, said NOR gate having an output coupled with said input of said output circuit, said output of said NOR gate generating said third clock signal.

14. A circuit, as recited in claim 13, wherein said asynchronous data is generated by a memory circuit.

15. A circuit, as recited in claim 13, wherein said asynchronous data is generated by a semiconductor memory.

* * * * *